United States Patent
Blish, II et al.

(10) Patent No.: US 7,157,131 B1
(45) Date of Patent: Jan. 2, 2007

(54) PREVENTION OF COUNTERFEIT MARKINGS ON SEMICONDUCTOR DEVICES

(75) Inventors: Richard C. Blish, II, Saratoga, CA (US); John James Slevin, Sunnyvale, CA (US)

(73) Assignee: Advanced Micro Devices Inc

( * ) Notice: Subject to any disclaimer, the term of this patent is extended or adjusted under 35 U.S.C. 154(b) by 676 days.

(21) Appl. No.: 10/212,950

(22) Filed: Aug. 6, 2002

(51) Int. Cl.
*B32B 3/24* (2006.01)
*B29C 35/08* (2006.01)
*G01R 31/26* (2006.01)
*H01L 23/29* (2006.01)

(52) U.S. Cl. .................. 428/138; 428/137; 264/400; 264/916; 257/797; 257/48; 257/788; 257/790; 257/787; 257/678; 438/14; 438/15; 438/16; 438/126

(58) Field of Classification Search .............. 428/138, 428/137, 916; 264/400; 257/797, 48, 788, 257/790, 787, 678; 438/14, 15, 16, 126, 438/127, 940
See application file for complete search history.

(56) References Cited

U.S. PATENT DOCUMENTS

| | | | |
|---|---|---|---|
| 5,418,855 A * | 5/1995 | Liang et al. ................. 713/179 |
| 5,985,377 A * | 11/1999 | Corbett ....................... 427/511 |
| 6,181,017 B1 * | 1/2001 | Hatchard et al. ............ 257/797 |
| 6,280,797 B1 * | 8/2001 | Kuczynski et al. .......... 427/457 |
| 6,331,735 B1 * | 12/2001 | Blish et al. .................. 257/777 |
| 6,339,728 B1 * | 1/2002 | Nguyen et al. .............. 700/125 |
| 6,432,796 B1 * | 8/2002 | Peterson ...................... 438/401 |
| 6,576,496 B1 * | 6/2003 | Bolken et al. ............... 438/110 |

* cited by examiner

*Primary Examiner*—William P. Watkins, III

(57) ABSTRACT

A lidded semiconductor device has a first layer applied to the lid, which first layer is chosen of a material which fluoresces upon application of non-visible electromagnetic waves thereto, for example, ultraviolet light. A second layer is provided over the first layer. Openings extend through the second layer and further extend to a substantial depth into the first layer, for example, generally halfway into the first layer, to expose portions of the first layer.

8 Claims, 3 Drawing Sheets

PREVENTION OF COUNTERFEIT MARKINGS ON SEMICONDUCTOR DEVICES

BACKGROUND OF THE INVENTION

1. Technical Field

This invention relates generally to semiconductor device marking, and more particularly, to the prevention of counterfeit marking thereof.

2. Background Art

FIG. 1 illustrates a typically marked semiconductor device 20. As shown therein, the semiconductor device 20 includes a die 22 having a lid or transfer molding compound such as epoxy 24 thereon. A white layer 26, for example, a layer of white paint, is provided on the lid 24, and the black layer 28, for example black paint, is provided on the layer 26. A laser cutting step is undertaken to provide openings (one shown at 30) in the layer black 28 to the full depth thereof down to the white layer 26, to expose portions of the white layer 26. The formed openings 30 are patterned to provide information about the product, for example, the name and logo of the manufacturing company, the type of product, and so on, with the white layer 26 portions exposed by the laser cuts providing good visible contrast to the black material 28 thereabove.

With this structure, it is readily possible for a counterfeiter to provide counterfeit markings as illustrated in FIG. 24. Initially, the counterfeiter could grind away the entire black layer 28 and further into the white layer 26 (FIG. 2). Thereafter, the counterfeiter could provide another, new black layer 32 over the remaining white layer 26A (FIG. 3) and provide laser cuts into the black layer 32 to provide openings 30 therein which expose portions of the layer 26A, with the cuts providing openings as chosen to form counterfeit markings (FIG. 4). Viewing of such markings would provide no evidence of counterfeiting.

Therefore, what is needed is a system which thwarts a counterfeiter's attempt to remove proper markings from a semiconductor device and replace them with counterfeit markings.

DISCLOSURE OF THE INVENTION

In the present marking system for a semiconductor device, a first layer is applied to the lid of the device, which first layer is chosen of a material which fluoresces upon application of non-visible electromagnetic waves thereto, for example, ultraviolet light. A second layer is provided over the first layer. Openings are provided through the first layer and further extend to a substantial depth into the first layer, for example, generally halfway into the first layer.

The present invention is better understood upon consideration of the detailed description below, in conjunction with the accompanying drawings. As will become readily apparent to those skilled in the art from the following description, there is shown and described an embodiment of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of an illustrative embodiment when read in conjunction with the accompanying drawings, wherein:

BEST MODE(S) FOR CARRYING OUT THE INVENTION

Reference is now made in detail to a specific embodiment of the present invention which illustrates the best mode presently contemplated by the inventors for practicing the invention.

Figure 1:
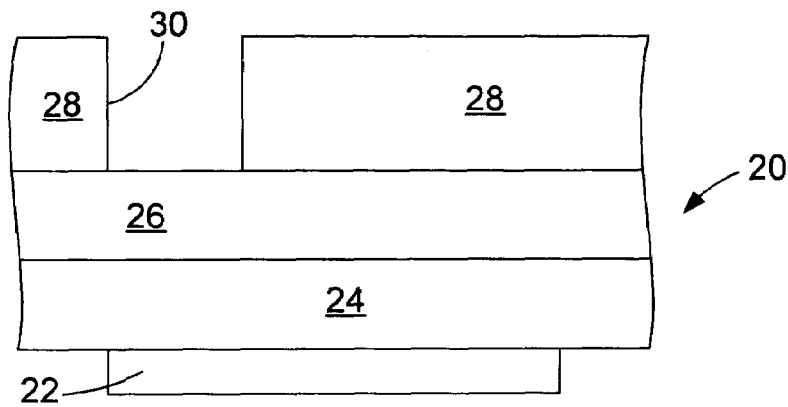
FIGS. 1–4 illustrate a proposed process for counterfeiting the markings of a semiconductor device.
Figure 2:
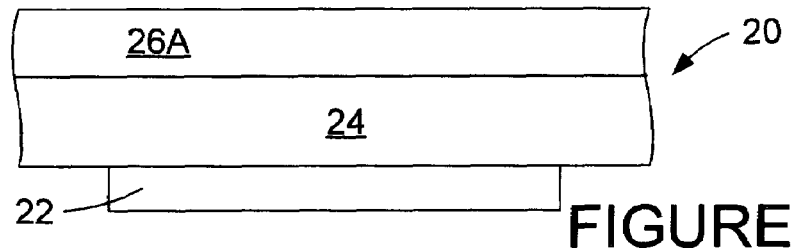
Figure 3:
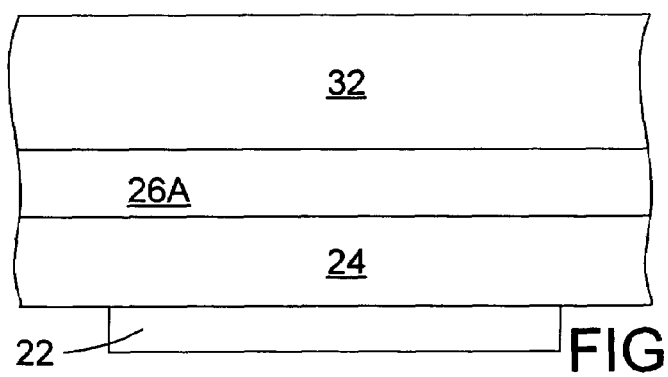
Figure 4:
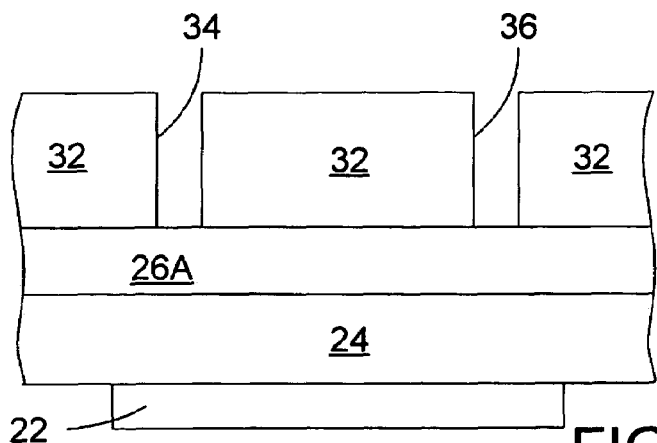
Figure 5:
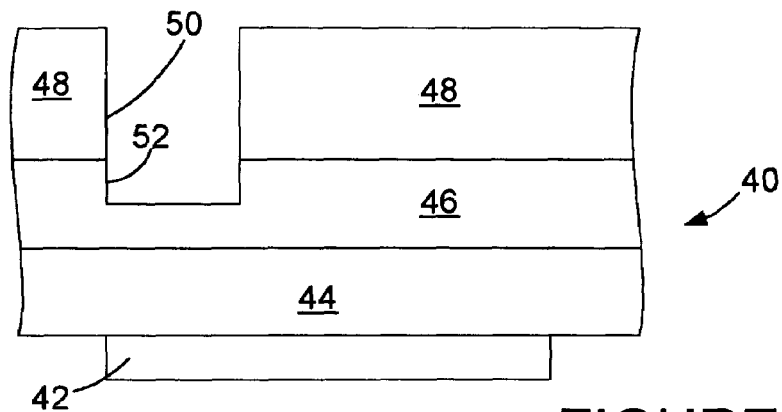
FIGS. 5–8 illustrate the present invention along with further steps of an attempt to counterfeiting markings thereof.

FIG. 5 illustrates a semiconductor device 40 incorporating the present invention. As shown therein, the semiconductor device 40 includes a die 42 having a lid or molding compound 44 thereon. A layer 46 (for example observed as white in visible light), which fluoresces upon application of electromagnetic waves (for example ultraviolet light) thereto, is provided on the lid 42. A black layer 48, for example Markem 2701, available from Markem Corporation, 150 Congress Street, Keene N.H. 03431, is provided on the layer 46. A laser cutting step is undertaken to provide openings (one shown at 50) entirely through the black layer 48 and extending into the first layer 46 to a substantial depth of the first layer 46, i.e., in this embodiment, generally halfway into the first layer 46, the openings 50 defining the markings of the device 40.

Figure 6:
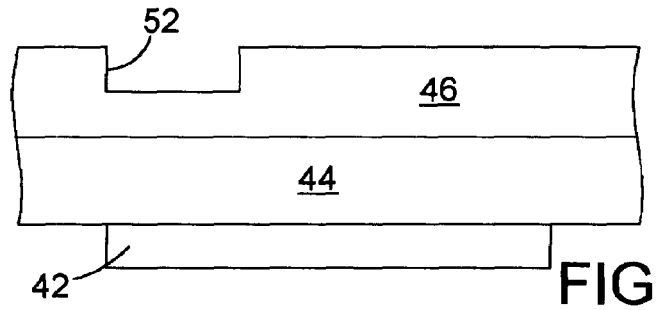
Figure 7:
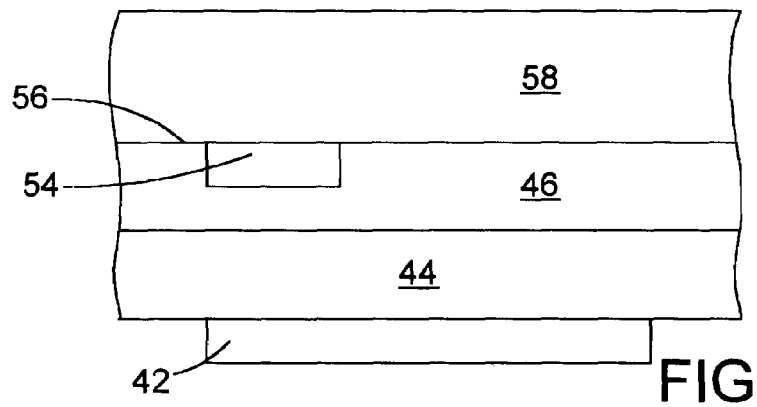
Figure 8:
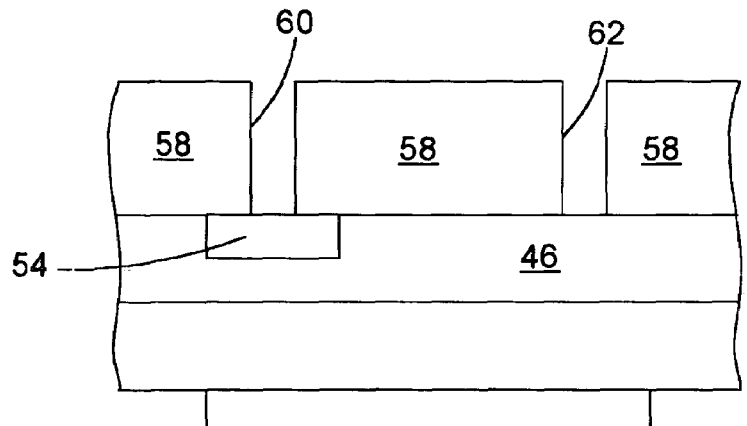

A first attempt at providing counterfeit markings on the device 40 of FIG. 5 is illustrated in FIGS. 6–8. In this attempt, the layer 48 is ground off down to the layer 46, exposing the layer 46 and leaving a recess 52 therein (FIG. 6). Prior to providing a black layer, the recess 52 is filled in by means of white filler material 54 (for example non-fluorescing, or fluorescing at a different electromagnetic wave energy level than layer 46) in order to provide a smooth surface 56 on which the black layer 58 is applied (FIG. 7). After application of the black layer 58 (FIG. 7), openings 60, 62 corresponding to counterfeit markings are provided through the black layer 58 down to the layer 46 and filler material 54 (FIG. 8), exposing a portion of the layer 46 and a portion of the filler material 54. Under visible light, the exposed portions of the filler material 54 and white layer 46 would provide proper visible contrast with the black layer 58. However, application of the proper electromagnetic waves (in this embodiment ultraviolet light) to the product would provide that only the portion of the layer 46 at the base of the opening 62 would fluoresce, while the portion of the filler material 54 at the base of the opening 60 would not fluoresce. This difference would clearly indicate counterfeit markings.

Figure 9:
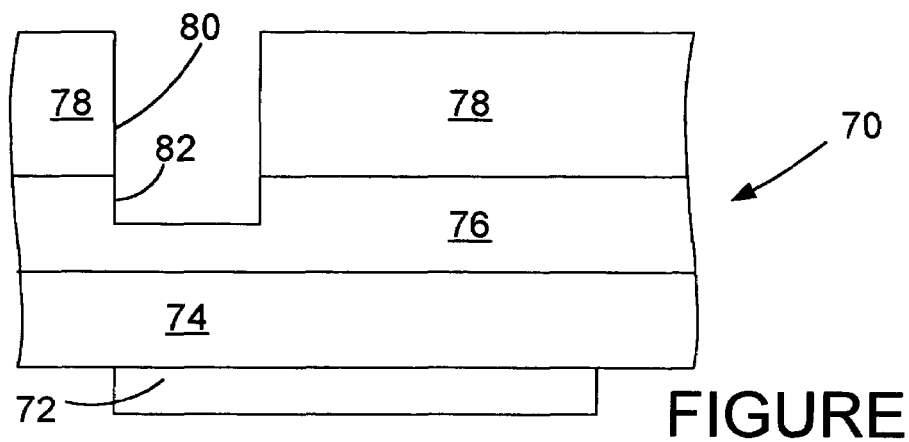
FIGS. 9–12 illustrate the present invention along with alternative steps of an attempt to counterfeit markings thereof.

FIG. 9 illustrates a semiconductor device 70 identical to that shown in FIG. 5. That is, the semiconductor device 70 includes a die 72 having a lid or molding compound 74 thereon. A layer 76 (for example observed as white in visible light), which fluoresces upon application of electromagnetic waves (for example ultraviolet light) thereto, is provided on the lid 72. A black layer 78, for example Marklin 2701, is provided on the layer 76. A laser cutting step is undertaken to provide openings (one shown at 80) entirely through the black layer 78 and extending into the first layer 76 to a substantial depth of the first layer 76, i.e., in this embodiment, generally halfway into the first layer 76, the openings 80 defining the markings of the device 70.

Figure 10:
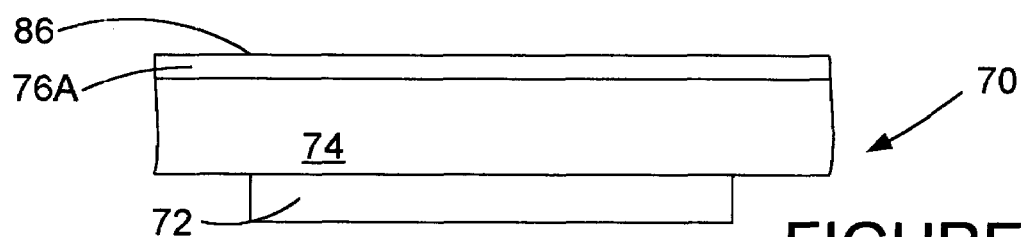
Figure 11:
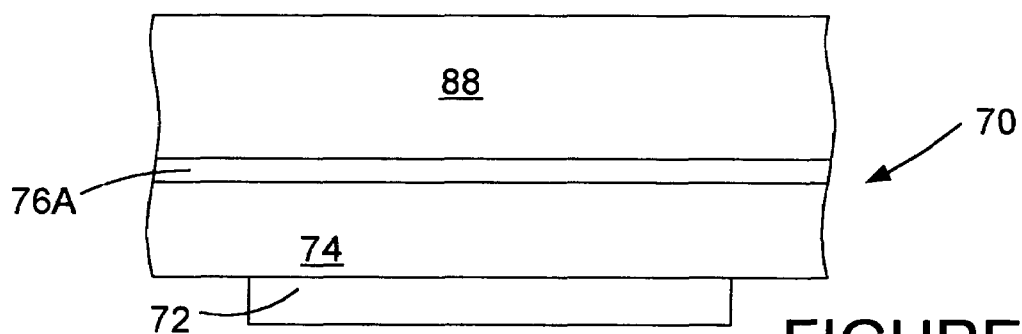
Figure 12:
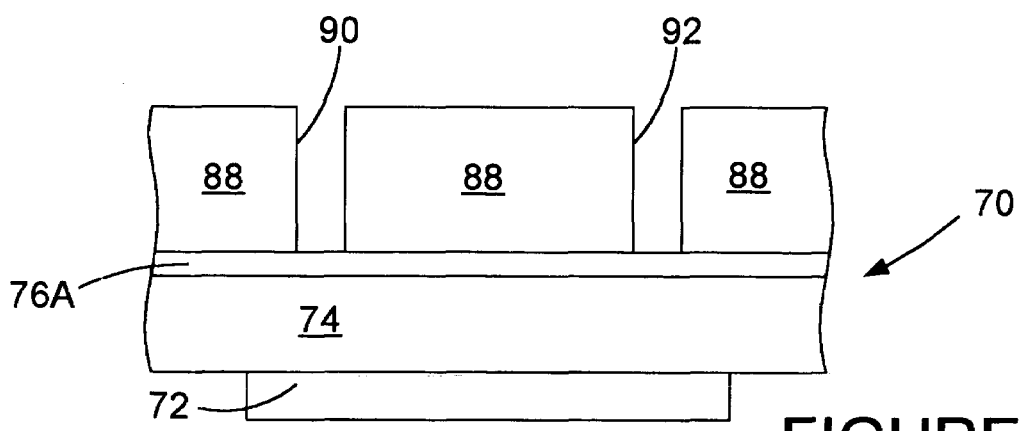

A second attempt at providing counterfeit markings on the device 70 of FIG. 9 (same as FIG. 5) is illustrated in FIGS. 10–12. In this attempt, the entire layer 78 and a portion of the layer 76 are ground off sufficiently to remove the recess 82 in the layer 76, resulting in a remaining layer 76A having a planar surface 86 (FIG. 10). After application of a black layer 88 to the layer 76A (FIG. 11), openings 90, 92 corresponding to the counterfeit markings are provided through the black layer 88 down to the layer 76A (FIG. 11), exposing portions of the layer 76A. Similar to the above example, exposed portions of the white layer 76A would provide proper visible contrast with the black layer 88. However, with the remaining layer 76A now thinner than the original layer 76 (in this embodiment shown as substantially thinner), upon application of ultraviolet light thereto, the thinner remaining layer 76A will fluoresce in a manner different from the layer 76 of original thickness. Thus, again, counterfeit markings would clearly be indicated by virtue of the thinner than original white layer 76.

In the event that the counterfeiter grinds off an amount of material with which both (1) leaves a portion of the recess in the fluorescing layer intact and also (2) thins that layer, it will be seen that both of the results described above will apply. That is, the filler material in the recess will not fluoresce, and the thinner layer will fluoresce in a manner different from that of the unthinned layer.

It will therefore be seen that the present approach overcomes attempts at counterfeiting markings on semiconductor devices.

The foregoing description of the embodiment of the invention has been presented for purposes of illustration and description. It is not intended to be exhaustive or to limit the invention to the precise form disclosed. Other modifications or variations are possible in light of the above teachings.

The embodiment was chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A marking structure for a body comprising:
   a first layer on the body, the first layer being of a material which is observable and apparent in visible light and which fluoresces upon application thereto of non-visible electromagnetic waves; and
   a second layer on the first layer, the second layer having an opening which extends through the second layer and into the first layer to a substantial depth of the first layer.

2. The marking structure of claim 1 wherein the opening extends generally halfway into the first layer.

3. The marking structure of claim 1 wherein the first layer is of a material which fluoresces upon application thereto of ultraviolet light.

4. The marking structure of claim 2 and further comprising a semiconductor device, the body being part of the semiconductor device.

5. A method of marking a body comprising:
   providing a first layer on the body, the first layer being of a material which is observable and apparent in visible light and which fluoresces upon application thereto of non-visible electromagnetic waves;
   providing a second layer on the first layer; and
   providing an opening in the second layer and extending therethrough and into the first layer to a substantial depth of the first layer.

6. The method of claim 5 and further comprising the step of providing that the opening extends through the second layer generally halfway into the first layer.

7. The method of claim 6 and further comprising the step of providing that the opening is formed by a laser.

8. The method of claim 7 and further comprising the step of providing that the body is part of a package of a semiconductor device.

* * * * *